(12) United States Patent
Fu et al.

(10) Patent No.: US 11,536,765 B2
(45) Date of Patent: Dec. 27, 2022

(54) PROBING APPARATUS

(71) Applicant: MPI Corporation, Hsinchu County (TW)

(72) Inventors: Kang-Yen Fu, Hsinchu County (TW); Ya-Hung Lo, Hsinchu County (TW); Shou-Jen Tsai, Hsinchu County (TW); Wei-Cheng Ku, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 62 days.

(21) Appl. No.: 16/892,076

(22) Filed: Jun. 3, 2020

(65) Prior Publication Data

US 2020/0400740 A1 Dec. 24, 2020

(30) Foreign Application Priority Data

Jun. 18, 2019 (TW) ................................. 108121160

(51) Int. Cl.
  *G01R 31/28* (2006.01)
  *H01L 21/67* (2006.01)
  *G01R 1/073* (2006.01)

(52) U.S. Cl.
  CPC ..... *G01R 31/2831* (2013.01); *G01R 1/07328* (2013.01); *H01L 21/67242* (2013.01)

(58) Field of Classification Search
  None
  See application file for complete search history.

(56) References Cited

U.S. PATENT DOCUMENTS

| | | | | |
|---|---|---|---|---|
| 2003/0178988 A1* | 9/2003 | Kim | .................... | G01R 31/2887 324/750.19 |
| 2008/0298948 A1* | 12/2008 | Yudate | ............... | G01R 31/2887 414/754 |
| 2010/0079161 A1* | 4/2010 | Endo | .................. | G01R 31/2887 324/754.12 |
| 2016/0266168 A1* | 9/2016 | Hsu | .................... | G01R 1/06705 |

FOREIGN PATENT DOCUMENTS

| | | |
|---|---|---|
| TW | 200535424 A | 11/2005 |
| TW | I653455 B | 3/2019 |

* cited by examiner

*Primary Examiner* — Nasima Monsur
(74) *Attorney, Agent, or Firm* — Birch, Stewart, Kolasch & Birch, LLP

(57) ABSTRACT

A probing apparatus includes a frame, a testing device, a rotatable testing platform, and a probe module. The testing device is disposed on the frame and is displaceable along an X direction and a Y direction perpendicular to the X direction. The rotatable testing platform is disposed on the frame and is rotatable around a rotating axis extending in the X direction. A direction perpendicular to the X direction and the Y direction is a Z direction, and the rotatable testing platform and the testing device are located at different positions of the Z direction. The probe module is disposed on the rotatable testing platform.

10 Claims, 8 Drawing Sheets

PROBING APPARATUS

CROSS-REFERENCE TO RELATED APPLICATION

This non-provisional application claims priority under 35 U.S.C. § 119(a) to Patent Application No. 108121160 in Taiwan, R.O.C. on Jun. 18, 2019, the entire contents of which are hereby incorporated by reference.

BACKGROUND

Technical Field

The instant disclosure relates to semiconductor testing equipment.

Related Art

Along with to the popularization of electronic products, electronic products mostly rely on a printed circuit board to integrate various electronic components to provide various functions. In the production process of the printed circuit boards, external factors may cause electrical defects such as short circuits, open circuits, and leakage. Therefore, the inspection of the printed circuit boards has always been an important part of the manufacturing process.

With the evolution of electronic product functions and the increase in complexity of the electronic product, single-layer printed circuit boards (single layer PCB) cannot meet the requirements of circuit wiring and electronic component configuration anymore. The double-layer printed circuit boards (double layer PCB) with double wiring area can meet the requirements of products with complex layouts. How to test the double-layer printed circuit board with wirings on both sides is the current issue to be encountered.

SUMMARY

In view of these, the instant disclosure provides a probing apparatus. The probing apparatus includes a frame, a testing device, a rotatable testing platform, and a probe module. The testing device is disposed on the frame and is displaceable along an X direction and a Y direction perpendicular to the X direction. The rotatable testing platform is disposed on the frame and is rotatable around a rotation axis extending in the X direction. A direction perpendicular to the X direction and the Y direction is a Z direction, and the rotatable testing platform and the testing device are located at different positions of the Z direction. The probe module is disposed on the rotatable testing platform.

In this way, the object to be tested can be clamped at the rotatable testing platform, so that both sides of the object to be tested can be probed at the same time. Moreover, the testing device is located at a place having the shortest distance from the object to be tested to the testing device, thereby being able to meet the configuration of the test signal lines for certain frequency testing.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
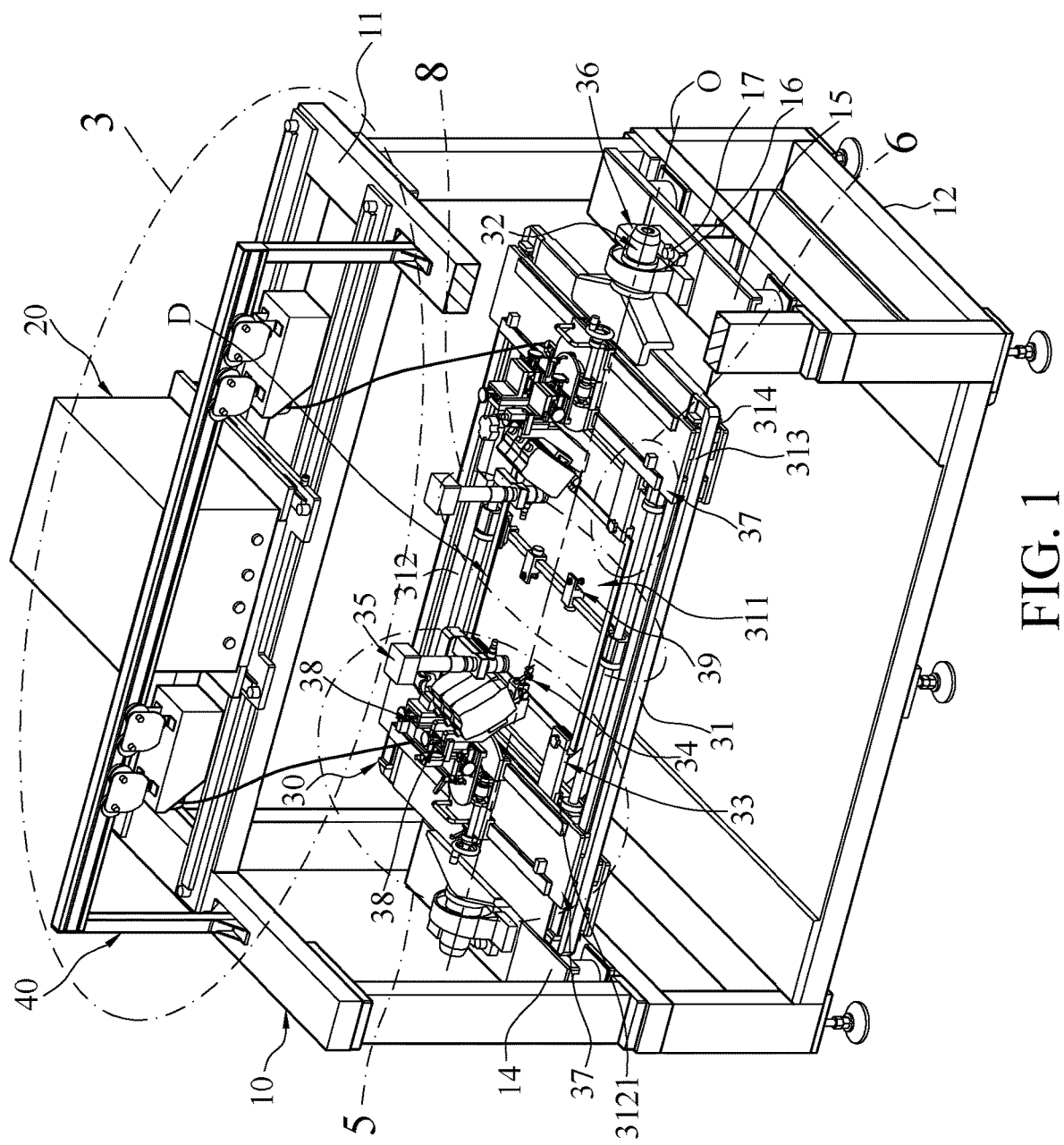
FIG. 1 illustrates a schematic view of a probing apparatus according to a first embodiment of the instant disclosure, in which the rotatable testing platform of the probing apparatus is in a horizontal position.

Please refer to FIG. 1. FIG. 1 illustrates a schematic view of a probing apparatus according to a first embodiment of the instant disclosure. The probing apparatus shown in the FIG. 1 comprises a frame 10, a testing device 20, a rotatable testing platform 30, and a probe module 34. The testing device 20 is disposed on the frame 10 and is displaceable along an X direction and a Y direction perpendicular to the X direction. The rotatable testing platform 30 is disposed on the frame 10 and is rotatable around a rotation axis O extending in the X direction. A direction perpendicular to the X direction and the Y direction is a Z direction, and the rotatable testing platform 30 and the testing device 20 are located at different positions of the Z direction. The probe module 34 is disposed on the rotatable testing platform 30. It is worth noting that the X direction, Y direction, and Z direction described below are based on the coordinate system shown in FIG. 1.

Figure 2:
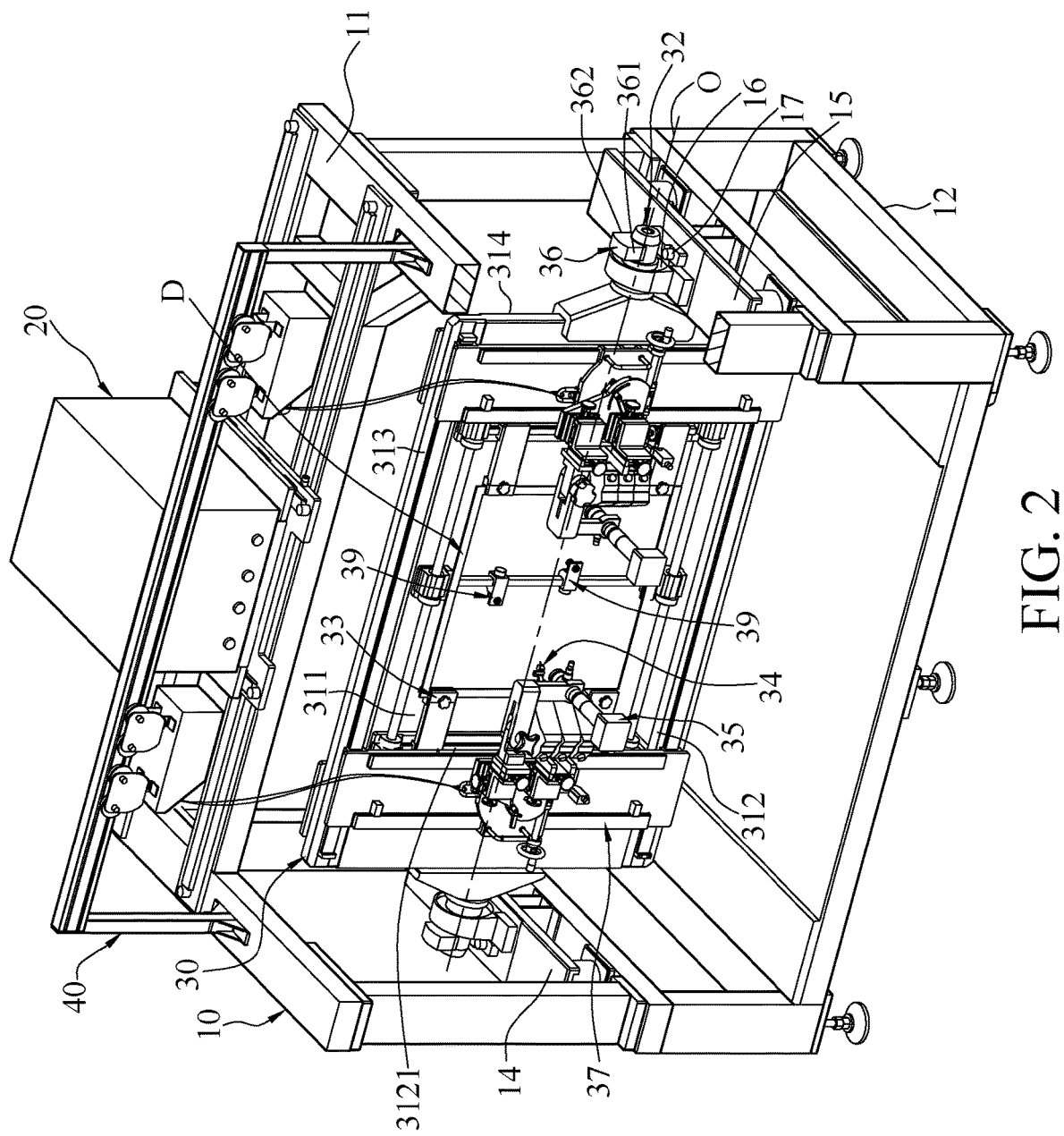
FIG. 2 illustrates a schematic view of the probing apparatus of the first embodiment, in which the rotatable testing platform is in a standing position.

Based on this, referring to FIG. 1 and FIG. 2 together, the rotatable testing platform 30 can clamp the to-be-tested object D, and the double-sided test can be performed when the rotatable testing platform 30 rotates to a standing state. Moreover, the testing device 20 is located at a place having a shortest distance from the to-be-tested object D to the testing device 20, thereby being able to meet the configuration of the test signal lines for certain frequency testing. In one embodiment, the probing apparatus of the instant disclosure may be, but not limited to, applied to the 110 GHz high-frequency measurement.

Figure 3:
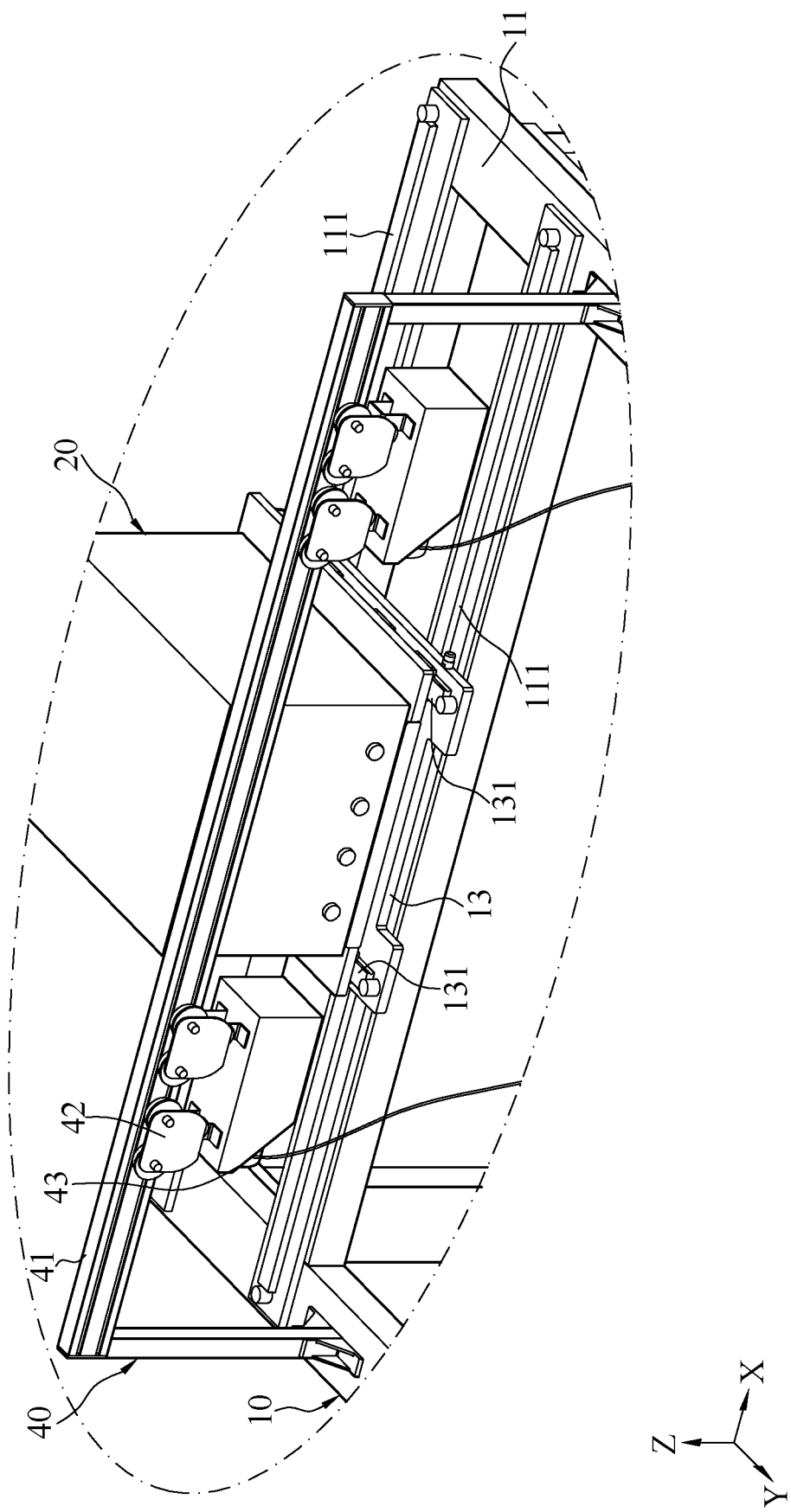
FIG. 3 illustrates an enlarged partial view of the circle 3 shown in FIG. 1.

In one embodiment, referring to FIGS. 1 to 3, the frame 10 has opposite upper side 11 and lower side 12. In this embodiment, the upper side 11 of the frame 10 is provides with first guide rails 111 that extend in the X direction. Specially, in this embodiment, the upper side 11 of the frame 10 is provided with two first guide rails 111, and the two first guide rails 111 are spaced with and parallel to each other.

Further, referring to FIGS. 1 to 3, in this embodiment, the testing device 20 is linearly displaceable on the upper side 11 of the frame 10. Specifically, in this embodiment, the frame further comprises a carrier 13 slidably disposed across the first guide rails 111, and the carrier 13 can slide in the X direction. Moreover, second guide rails 131 are further provided on the carrier 13, the second guide rails 131 extend in the Y direction perpendicular to the Z direction and the X direction. Specially, in this embodiment, two second guide rails 131 are provided on the carrier 13 and the two second guide rails 131 are spaced with and parallel to each other.

In one embodiment, referring to FIGS. 1 to 3, the testing device 20 is sildably disposed across the second guide rails 131, so that the testing device 20 can slide along the Y direction. Thereby, the testing device 20 can be linearly displaced on the upper side 11 of the frame 10 through the first guide rails 111, the carrier 13, and the second rails 131, and the testing device 20 is displaceable along the X direction and the Y direction.

In this embodiment, referring to FIGS. 1 to 3, the first guide rails 111 extend over the entire frame 10 in the X direction. Thereby, the testing device 20 is displaceable within the range of the entire frame 10 along the X direction, so that the shortest distance between the testing device 20 and the rotatable testing platform 30 can be maintained. Because of the design of the second guide rails 131, the testing device 20 is displaceable within a certain range along the Y direction of the entire frame 10, in particular, in one embodiment, the testing device 20 can move toward the side of the to-be-tested object D which is away from the testing device 20. When the length of the transmission line between the testing device 20 and the probe module 34 is fixed or not long enough, the pad of the to-be-tested object D which has a relatively longer distance to the testing device 20 can be tested by adjusting the position of the testing device 20 in the Y direction.

Figure 5:
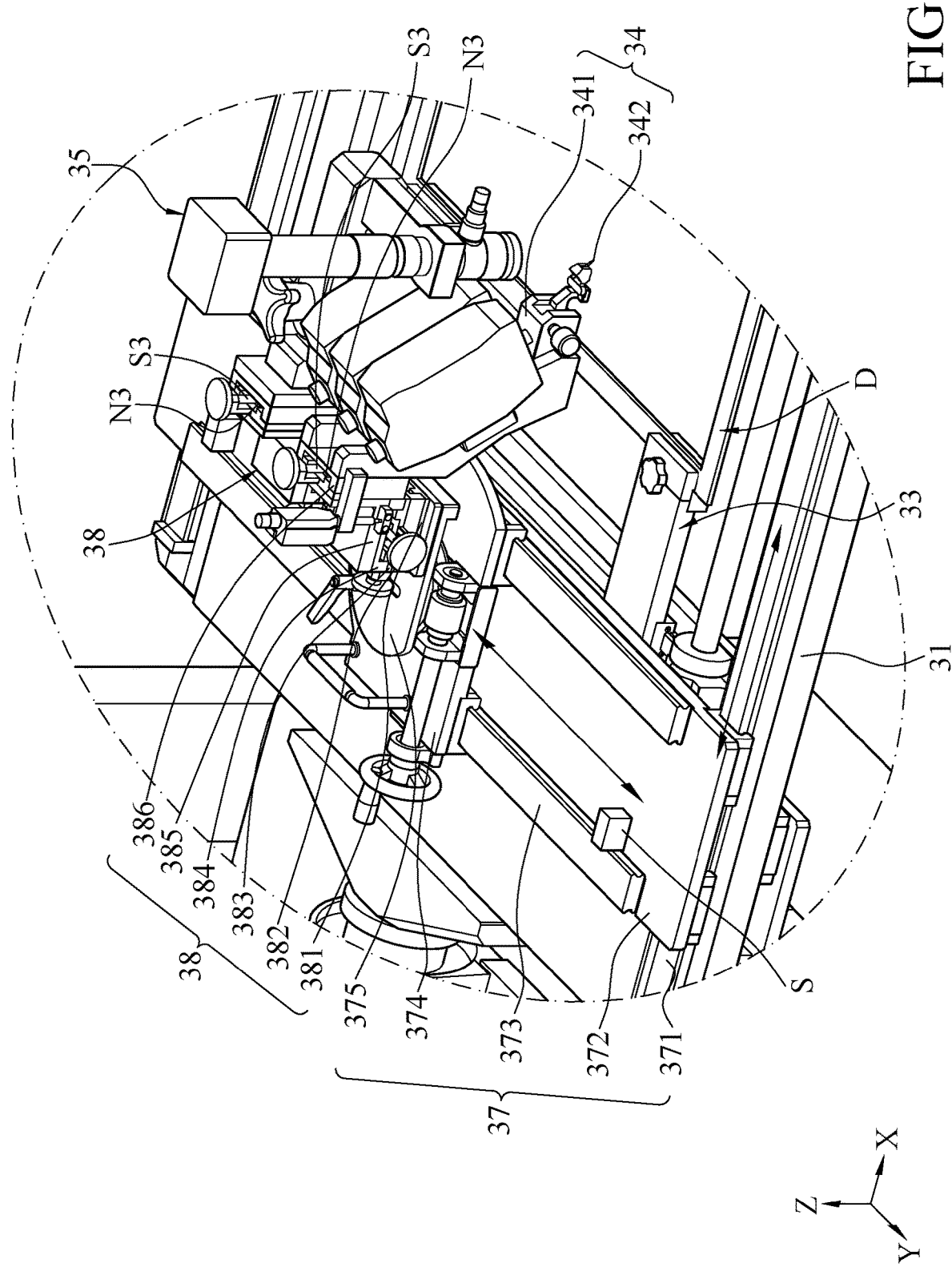
FIG. 5 illustrates an enlarged partial view of the circle 5 shown in FIG. 5.

In one embodiment, referring to FIGS. 1, 2 and 5, the rotatable testing platform 30 is used to clamp the to-be-tested object D and can be turned over to perform a double-sided test on the to-be-tested object D. The rotatable testing platform 30 is disposed on the frame 10 and is rotatable around a rotation axis O extending in the X direction. In this embodiment, the frame 10 has a first platform 14 and a second platform 15 opposite to each other between the upper side 11 and the lower side 12, and the first platform 14 and the second platform 15 are located at the same position of the Z direction. The rotatable testing platform 30 is rotatably disposed on the first platform 14 and the second platform 15. Specifically, in this embodiment, the first platform 14 and the second platform 15 are respectively provided with shaft assemblies 16, and the rotatable testing platform 30 includes a frame 31, two rotation shafts 32, a clamping mechanism 33, a probe module 34, and a photography module 35. The rotation shafts 32 are respectively disposed at the opposite two sides of the frame 31. The rotation shafts 32 of the frame body 31 pass through the shaft assembly 16 of the first platform 14 and the shaft assembly 16 of the second platform 15, so that the frame 31 can rotate around the rotation axis O defined by the connection line between the rotation shafts 32. In this embodiment, the rotation shafts 32 extend in the X direction, and when the rotatable testing platform 30 rotates, the rotatable testing platform 30 can rotate around the rotation axis O extending in the X direction. Based on the foregoing descriptions, since the frame 31 of the rotatable testing platform 30 is rotatably disposed on the first platform 14 and the second platform 15 between the upper side 11 and lower side 12, the testing device 20 is located above the rotatable testing platform 30, and the testing device 20 is displaceable along the X direction to cover the entire rotatable testing platform 30. Accordingly, the position of the testing device 20 can be adjusted according to the test position of the to-be-tested object D so as to maintain the shortest distance between the testing device 20 and the probe module 34.

In one embodiment, the probing apparatus may further comprise a deceleration mechanism (not shown in the figures), and the deceleration mechanism may be an assembly of a worm wheel and a worm shaft. Specifically, the worm wheel is coaxially fixed to the rotation shaft 32 of the rotatable testing platform 30, and the worm shaft remains engaged with the worm wheel. In this way, rotating the worm shaft can drive the worm wheel to rotate, and the worm wheel can then drive the rotation shaft 32 to rotate, and then further drive the rotatable testing platform 30 to change the angle of the rotatable testing platform 30. Therefore, the user can change the angle of the rotatable testing platform 30 by rotating the worm shaft. Further, a handle may be connected to the worm shaft to facilitate the user's operation. Moreover, in this embodiment, by rotatable testing platform 30 through the cooperation of the worm wheel and the worm shaft, the require reduction ratio can be achieved, so that the maximum torque output can be obtained with the smallest power output, thereby achieving the labor-saving effect. Even more, the worm shaft with a proper guide angle can prevent the reverse rotation of the worm wheel so as to achieve the self-locking function of the rotatable testing platform 30.

Figure 4:
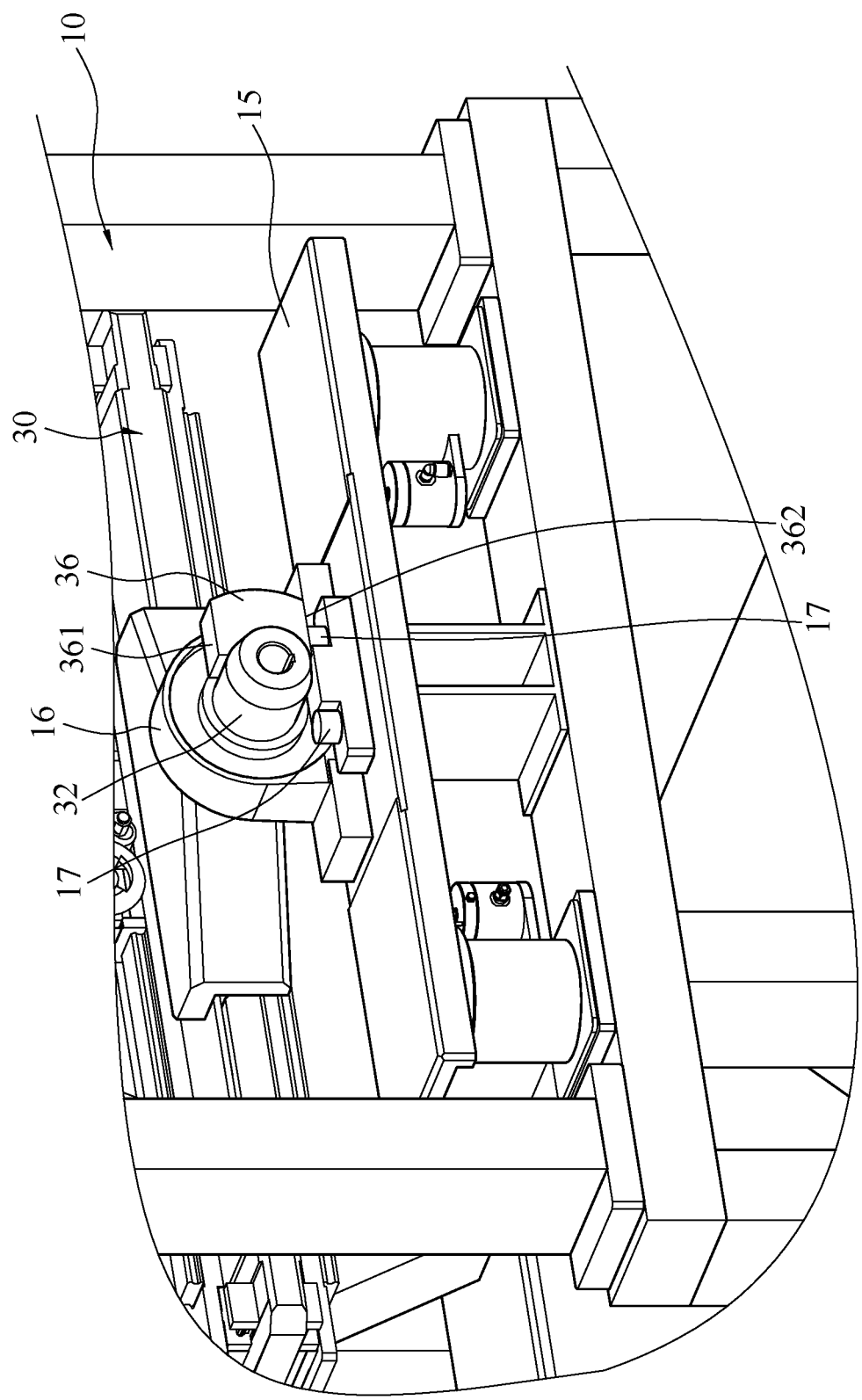
FIG. 4 illustrates an enlarged partial view of the probing apparatus of one embodiment of the instant disclosure.

In one embodiment, referring to FIGS. 1, 2, and 4, in order to enable the rotatable testing platform 30 to be positioned at a certain position for performing the test stably, the probing apparatus may further include a limiting structure 36. Specifically, in this embodiment, the limiting structure 36 is a block structure having a first plane 361 and a second plane 362. In this embodiment, the limiting structure 36 is disposed on the rotation shaft 32 of the rotatable testing platform 30 to rotate with the rotatable testing platform 30, and the angular rotation range of the rotatable testing platform 30 is limited by the limiting structure 36. Specifically, in this embodiment, when the rotatable testing platform 30 rotates, the rotation shaft 32 of the rotatable testing platform 30 drives the limiting structure 36 to rotate. Moreover, during the rotation of the rotation shafts 32, the first plane 361 or the second plane 362 abut against the frame 10 to limit a rotation range of the rotation shaft 32 to be less than 360 degrees. That is, the available range of the rotation angle of the rotatable testing platform 30 will be limited due to the abutting of the limiting structure 36, and the rotatable testing platform 30 can be limited to rotate to a certain angle or certain angles.

In one embodiment, referring to FIGS. 1, 2, and 4, the first platform 14 and the second platform 15 of the frame 10 are respectively provided with a block 17. When the rotatable testing platform 30 rotates to a horizontal position, the limiting structure 36 abuts against the blocks 17 with the first plane 361 or the second plane 362. The horizontal position of the rotatable testing platform 30 is as shown in FIG. 1, and the horizontal position indicates that the frame body 31 of the rotatable testing platform 30 is at the horizontal position. Thereby, the user can quickly operate the rotatable testing platform 30 to a position with a certain angle. Furthermore, the block 17 may be made of a material with a buffering function, thereby buffering the impact force on the block 17 when the limiting structure 36 impacts the block 17. Therefore, the stability of the to-be-tested object D or the probe module 34 on the rotatable testing platform 30 can be ensured. Of course, it is understood that, the rotatable testing platform 30 is not limited to be rotated to the horizontal position when the first plane 361 or the second plane 362 abuts against the frame 10 or the blocks 17.

In one embodiment, referring to FIGS. 1 and 5, the clamping mechanism 33, the probe module 34, and the photography module 35 are respectively disposed on the frame 31. The clamping mechanism 33 is used to clamp the to-be-tested object D, the probe module 34 is used to fix a probe 342 to perform the probe test on the to-be-tested object D, and the photography module 35 keeps focusing on the probe 342, so that the operator can observe the position of the probe 342. In this embodiment, four clamping mechanisms 33 are provided on the frame body 31, but not limited to thereto; each of the clamping mechanisms 33 is respectively displaceably disposed on the frame body 31 of the rotatable testing platform 30.

Specifically, referring to FIGS. 1 to 5, in one embodiment, the frame body 31 of the rotatable testing platform 30 is a rectangular frame body 31 having a hollow portion 311. Moreover, the frame body 31 has an inner peripheral surface 312, a first surface 313, a second surface 314. The inner peripheral surface 312 faces the hollow portion 311 and has a rectangular outline. The first surface 313 and the second surface 314 are opposite to each other, and the first surface 313 and the second surface 314 are respectively connected to two ends of the inner peripheral surface 312.

Figure 6:
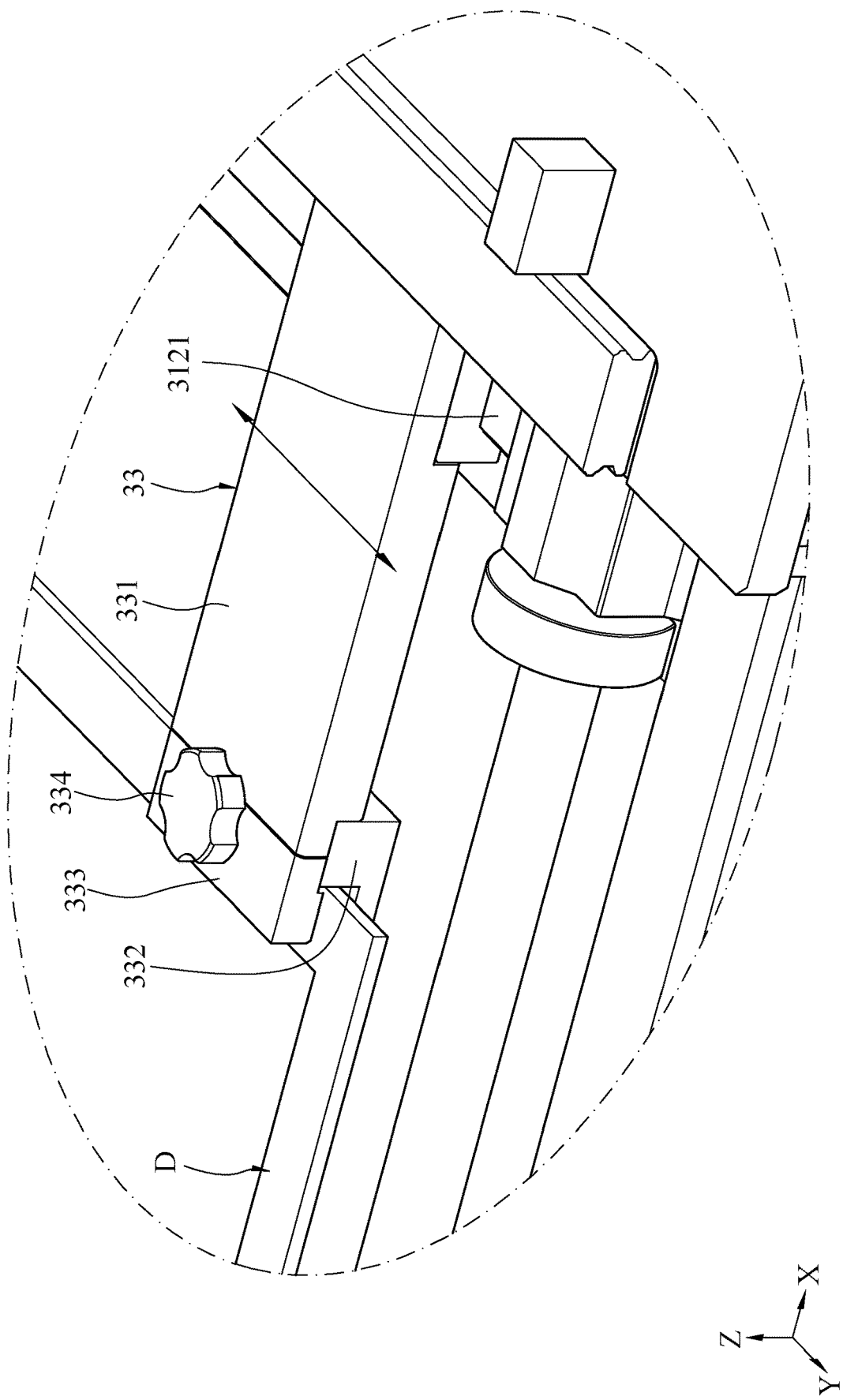
FIG. 6 illustrates an enlarged partial view of the circle 6 shown in FIG. 6.

In one embodiment, referring to FIGS. 1, 2, and 6, two third guide rails 3121 are disposed on opposite two sides of the inner peripheral surface 312, and each of the third guide rails 3121 extends in the Y direction. In this embodiment, two clamping mechanisms 33 are slidably disposed on each of the third guide rails 3121, and the positions of the two clamping mechanisms 33 in the Y direction can be changed along the corresponding third guide rail 3121. Hence, the positions of the clamping mechanisms 33 on the rotatable testing platform 30 can be changed so as to be suitable for clamping to-be-tested objects D with different sizes.

In one embodiment, referring to FIG. 6, the clamping mechanism 33 may comprise, but not limited to, a supporting portion 331, a first jaw portion 332, a second jaw portion 333, and an adjusting member 334. One of two ends of the supporting portion 331 is slidably fitted over the third guide rail 3121, the first jaw portion 332 is fixed to the other end of the supporting portion 331. The second jaw portion 333 overlaps the first jaw portion 332. The adjusting member 334 is screwed with the first jaw portion 332 and the second jaw portion 333. Therefore, by rotating the adjusting member 334, the space between the first jaw portion 332 and the second jaw portion 333 can be adjusted. When the adjusting member 334 is released, the to-be-tested object D can be freely placed or taken between the first jaw portion 332 and the second jaw portion 333. When the adjusting member 334 is locked, the to-be-tested object D can be clamped to perform the probe test stably.

In this embodiment, the clamping mechanism 33 is not limited to clamp the to-be-tested object D, a probe calibration piece may be provided on the clamping mechanism 33 to perform the calibration of the probe 342.

In one embodiment, referring to FIGS. 1 and 2, the frame 31 is provided with two probe modules 34 and two photography modules 35. Each of the probe modules 34 and each of the photography modules 35 are concurrently moved or rotated along the X direction or the Y direction. Moreover, the position of each of the probe modules 34 and the position of each of the photography modules 35 along the X direction, Y direction, and Z direction can be respectively finely adjusted.

In one embodiment, referring to FIGS. 1, 2, and 5, the rotatable testing platform 30 further comprises a first displacement assembly 37, the probe module 34 and the photography module 35 are disposed on the first displacement assembly 37, so that the probe module 34 and the photography module 35 are concurrently moved or rotated along the X direction or the Y direction. Specifically, in this embodiment, the first displacement assembly 37 includes two fourth guide rails 371, a first slide table 372, two fifth guide rails 373, a second slide table 374, and a rotation base 375. Each of the fourth guide rails 371 extends in the X direction, and the two fourth guide rails 371 are spacedly disposed on the first surface 313 of the frame 31 in parallel. The first slide table 372 is slidably disposed on each of the fourth guide rails 371 so as to be displaceable along the X direction. Each fifth guide rail 373 extends in the Y direction, and two fifth guide rails 373 are disposed on the first slide table 372 in parallel with intervals. The second slide table 374 is slidably disposed on each fifth rail 373 and is displaceable along the Y direction. The rotating base 375 is rotatably disposed on the second slide table 374.

In one embodiment, referring to FIGS. 1, 2, and 5, the rotatable testing platform 30 further comprises second displacement assemblies 38. In this embodiment, two second displacement assemblies 38 are disposed on each of the first displacement assemblies 37, and each of the second displacement assemblies 38 is disposed on the rotating base 375 of the corresponding first displacement assembly 37. The probe module 34 and the photography module 35 are respectively disposed on the second displacement assemblies 38. The second displacement assemblies 38 can provide linear displacements along the X, Y and Z directions, and the first displacement assemblies 37 can provide linear displacements and rotational displacements along the X and Y directions. Accordingly, by controlling the first displacement assembly 37, the second displacement assemblies 38 disposed on the first displacement assembly can be driven to move, and the second displacement assemblies 38 can drive the probe module 34 and the photography module 35 to move respectively. In one embodiment, the available displacement range of the first displacement assembly 37 along the X direction and the Y direction is greater than the available displacement range of the second displacement assembly 38 along the X direction and the Y direction. In this way, the first displacement assembly 37 can drive the probe module 34 and the photography module 35 to perform a large-scale displacement in the same direction at the same time, and the second displacement assemblies 38 can fine-tune the positions of the probe module 34 and the photography module 35. Thus, the probe module 34 and the photography module 35 can be properly and finely adjusted to be suitable for different to-be-tested objects D.

Figure 7:
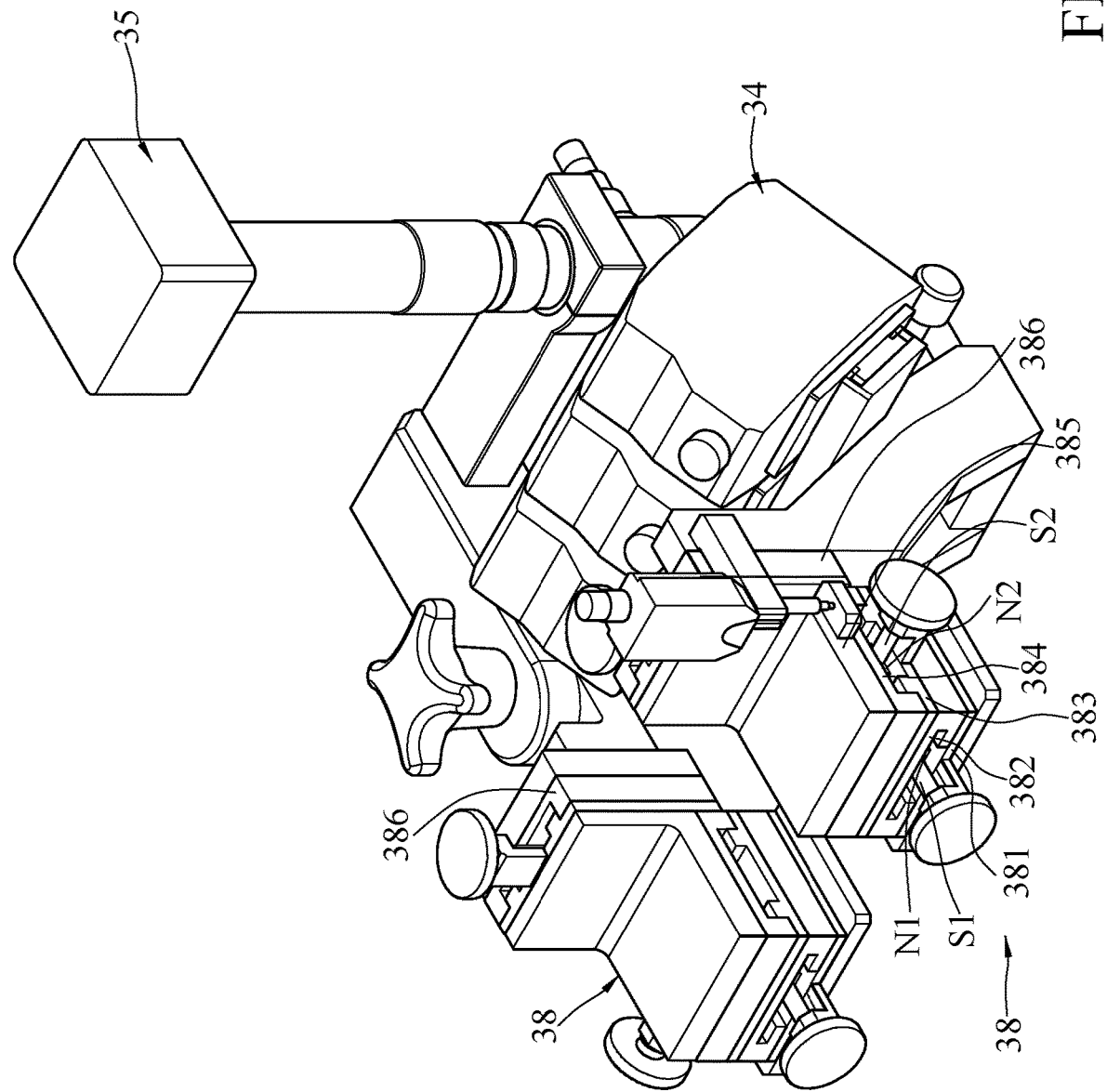
FIG. 7 illustrates a schematic view showing a probe module and a photography module of the probing apparatus of one embodiment of the instant disclosure.

Specifically, in an embodiment, referring to FIGS. 5 and 7, each of the second displacement assemblies 38 includes a first base 381, a first slide base 382, a second base 383, a second slide base 384, a third base 385, and a third slide base 386. The first base 381 is fixedly disposed on the rotation base 375 of the first displacement assembly 37, and the first slide base 382 is slidably fitted over the first base 381 and is displaceable along the X direction. The second base 383 is fixedly disposed on the first slide base 382, and the second slide base 384 is slidably fitted over the second base 383 and is displaceable along the Y direction. The third base 385 is fixedly disposed on the second slide base 384, and the third slide base 386 is slidably fitted over the third base 385 and is displaceable along the Z direction.

In one embodiment, referring to FIG. 7, a combination of nut and screw can be disposed between the first base 381 and the first slide base 382, between the second base 383 and the second slide base 384, and between the third base 385 and the third slide base 386 for controlling motions of these elements.

In one embodiment, referring to FIG. 7, a first screw S1 is disposed on the first base 381. The first screw S1 extends in the X direction and is rotatable. A first nut N1 is fixedly disposed on a surface of the first slide base 382 facing the first base 381, and the first nut N1 is screwed with the first screw S1. Therefore, rotating the first screw S1 can make the first nut N1 drive the first slide base 382 to displace along the X direction.

In one embodiment, referring to FIG. 7, a second screw S2 is disposed on the second base 383. The second screw S2 extends in the Y direction and is rotatable. A second nut N2 is fixedly disposed on a surface of the second slide base 384 facing the second base 383, and the second nut N2 is screwed with the second screw S2. Therefore, rotating the second screw S2 can make the second nut N2 drive the second slide base 384 to displace along the Y direction.

In one embodiment, referring to FIG. 7, a third screw S3 is disposed on the third base 385. The third screw S3 extends in the Z direction and is rotatable. A third nut N3 is fixedly disposed on a surface of the third slide base 386 facing the third base 385, and the third nut N3 is screwed with the third screw S3. Therefore, rotating the third screw S3 can make the third nut N3 drive the third slide base 386 to displace along the Z direction.

In one embodiment, referring to FIGS. 5 and 7, The probe module 34 includes a probe base 341 and a probe 342. The probe base 341 is fixedly disposed on the third slide base 386 of one of the second displacement assemblies 38, and the probe 342 is disposed on the probe base 341. The photography module 35 is disposed on the third slide base 386 of another second displacement assembly 38. In this way, during performing the probe test, the probe module 34 and the photography module 35 can be moved to be close to the predetermined testing position in a manner of quick and large-scaled through the first displacement assembly 37. Then, positions of the probe module 34 and the photography module 35 in the X direction, Y direction, and the Z direction can be finely adjusted through the second displacement assembly 38. Therefore, the probe module 34 and the photography module 35 are accurately positioned at the probe testing position. In this way, the accuracy of the probe test can be ensured, and the convenience and efficiency of adjusting the probe module 34 and the photography module 35 can be enhanced.

In one embodiment, referring to FIGS. 1, 2, and 5, the extension range of the fourth guide rails 371 covers the range of the hollow portion 311 in the X direction, and the extension range of the first slide table 372 covers the range of the hollow portion 311 in the Y direction. In this way, the positions of the probe module 34 and the photography module 35 on the rotatable testing platform 30 can be properly adjusted, so that detection blind spots can be reduced.

In one embodiment, referring to FIG. 5, in order to limit the displacement of the probe module 34, a stopper S may be further provided. In this embodiment, the stopper S is a block and disposed on the first slide table 372 near the two ends of the fifth guide rails 373, and the stopper S is located at the displacement path of the second slide table 374. In this way, the stopper S can limit the displacement range of the second slide table 374 to prevent the second slide table 374 from unrestrictedly sliding along the fifth guide rails 373 and falling off from the fifth guide rails 373. Therefore, when the rotatable testing platform 30 rotates to a standing state, the probe module 34 can be ensured to kept locating on the first slide table 372. In one embodiment, the height of the stopper S is greater than the height of the fifth guide rails 373 to limit the displacement of the second sliding table 374.

In one embodiment, referring to FIGS. 1 and 3, the probing apparatus further comprises a suspension module 40. The suspension module 40 comprises a support 41, a pulley 42, and a hoist 43. The support 41 is fixed on the frame 10, the pulley 42 is disposed on the support 41 and displaceable along the X direction, and the hoist 43 is disposed on the pulley 42. In this embodiment, the hoist 43 can be coupled to the probe module 34 with a rope. The connection between hoist 43 and the probe module 34 may be implemented by, for example, directly binding one end of the rope to the probe module 34, or using a hook as a connection intermediate between one end of the rope and the probe module 34. In this way, when the rotatable testing platform 30 rotates to the standing state, the hoist pulls the probe module 34 to prevent the probe module 34 from falling off without signs. At the same time, the hoist 43 can also be used as a driving source for the probe module 34 to move along the Z direction, so that the hoist 43 pulls the probe module 34 to move along the Z direction.

Figure 8:
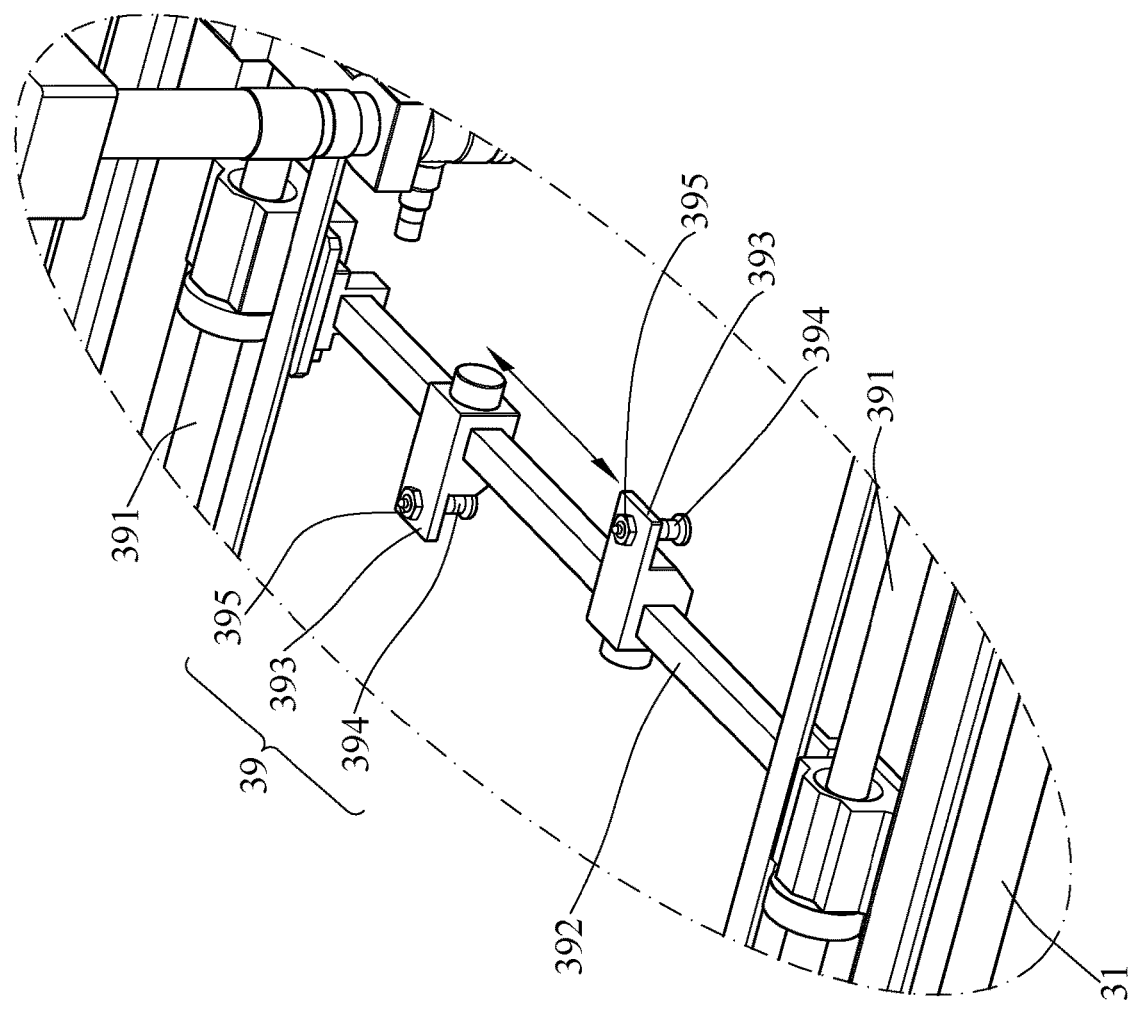
FIG. 8 illustrates an enlarged partial view of the circle 8 shown in FIG. 1.

Further, referring to FIGS. 1 and 8, in order to avoid the local warpage condition after the to-be-tested object D is clamped on the rotatable testing platform 30, in one embodiment, the rotatable testing platform 30 may further comprise a top post structure 39. The position of the top post structure 39 can be adjusted and the top post structure 39 can abut against the to-be-tested object D. Specifically, in this embodiment, the rotatable testing platform 30 further comprises two guide rods 391 and a slide rod 392. Each of the guide rods 391 extends in the X direction and disposed on opposite sides of the inner peripheral surface 312 of the frame 31. The slide rod 392 extends in the Y direction and both ends of the slide rod are slidably disposed on the second guide rod 391, so that the slide rod 392 can slide along the X direction. In this embodiment, the top post structure 39 is slidably disposed on the slide rod 392 and is displaceable along the Y direction.

Specifically, in one embodiment, referring to FIGS. 1 and 8, the top post structure 39 comprises a sliding block 393, a top column 394, and a positioning member 395. The sliding block 393 is slidably fitted over the slide rod 392. The top column 394 extends in the Z direction and is displaceably passing through the sliding block 393 along the Z direction. The positioning member 395 is disposed on the top column 394 to position the top column 394 at a certain position of the Z direction. In this embodiment, the top column 394 may be, but not limited to, a rod with threaded patterns, and the positioning member 395 may be, but not limited to, a nut. In this embodiment, the top column 394 passes through the sliding block 393 and is locked with the positioning member 395, so that the top column 394 are located at a certain position of the Z direction.

In one embodiment, the rotatable testing platform 30 may be, but not limited to, provided with two top post structures 39. In this way, the top post structures 39 can be displaced along the Z direction according to the board warpage condition of the to-be-tested object D so as to abut against the to-be-tested object D firmly, thereby reducing the board warpage of the to-be-tested object D.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A probing apparatus, comprising:
   a frame, comprising a carrier and a first guide rail, wherein the first guide rail extends in an X direction, the carrier is slidably disposed across the first guide rail and slidable in the X direction;

a testing device, disposed on the carrier of the frame and being displaceable along the X direction and a Y direction perpendicular to the X direction;

a rotatable testing platform, used to clamp a to-be-tested object to perform a double-sided test on the to-be-tested object and can be turned over from a first position to a second position, the rotatable testing platform being disposed on the frame and being rotatable around a rotation axis extending in the X direction, wherein the rotation axis is parallel to the first guide rail, a direction perpendicular to the X direction and the Y direction is a Z direction, the rotatable testing platform and the testing device are located at different positions of the Z direction perpendicular to the rotation axis, the rotatable testing platform is disposed under the carrier and the first guide rail; and a probe module, disposed on the rotatable testing platform, wherein the probe module is disposed under the carrier and the first guide rail, wherein when the rotatable testing platform at the first position, the rotatable testing platform is parallel to a plane constructed from the X direction and the Y direction, when the rotatable testing platform at the second position, an angle is formed between the rotatable testing platform and the plane constructed from the X direction and the Y direction.

2. The probing apparatus according to claim 1, wherein two opposite sides of the rotatable testing platform respectively includes a rotation shaft, and the rotation shafts are rotatably disposed on the frame.

3. The probing apparatus according to claim 2, further comprising a worm wheel and a worm shaft, wherein the worm wheel is connected to the rotation shaft, and the worm shaft is engaged with the worm wheel.

4. The probing apparatus according to claim 2, further comprising a limiting structure disposed at the rotation shaft, wherein the limiting structure is a block structure having a first plane and a second plane, and during a rotation of the rotation shaft, the limiting structure rotates with the rotatable testing platform, the first plane and the second plane abut against the frame to limit a rotation range of the rotation shaft to be less than 360 degrees.

5. The probing apparatus according to claim 1, wherein the rotatable testing platform further comprises a frame body and a plurality of clamping mechanisms, the frame body has an inner peripheral surface, and the clamping mechanisms are respectively disposed on the inner peripheral surface and are displaceable along the Y direction.

6. The probing apparatus according to claim 1, further comprising a photography module disposed on the rotatable testing platform.

7. The probing apparatus according to claim 6, further comprising a first displacement assembly, wherein the probe module and the photography module are disposed on the first displacement assembly, so that the probe module and the photography module are concurrently moved or rotated along the X direction or the Y direction.

8. The probing apparatus according to claim 7, further comprising two second displacement assemblies, wherein the two second displacement assemblies are disposed on the first displacement assembly, and the probe module and the photography module are respectively disposed on the two second displacement assemblies, so that the probe module and the photography module are displaceable along the X direction, the Y direction, and the Z direction.

9. The probing apparatus according to claim 1, further comprising two guide rods, a slide rod, and a top post structure, wherein the two guide rods are disposed on the rotatable testing platform and extend in the X direction, the slide rod extends in the Y direction and slidably disposed between the two guide rods, and the top post structure is displaceable along the Z direction and is slidably disposed on the slide rod.

10. The electronic component probing apparatus according to claim 1, further comprising a suspension module, wherein the suspension module comprises a support, a pulley, and a hoist, the support is fixed on the frame, the pulley is disposed on the support and displaceable along the X direction, and the hoist is disposed on the pulley.

* * * * *